United States Patent [19]

Meusburger et al.

[11] 4,035,207
[45] July 12, 1977

[54] PROCESS FOR PRODUCING AN INTEGRATED CIRCUIT INCLUDING A J-FET AND ONE COMPLEMENTARY MIS-FET

[75] Inventors: Guenther Meusburger, Munich; Hartmut Runge, Kirchseeon, both of Germany

[73] Assignee: Siemens Aktiengesellschaft, Berlin & Munich, Germany

[21] Appl. No.: 712,754

[22] Filed: Aug. 9, 1976

[30] Foreign Application Priority Data

Aug. 22, 1975 Germany .................... 2537559

[51] Int. Cl.² .............. H01L 21/225; H01L 21/265
[52] U.S. Cl. ................................ 156/628; 29/591; 148/1.5; 148/188; 156/643; 156/649; 357/22; 357/91; 427/91
[58] Field of Search ............... 29/591; 156/17, 18, 156/7, 8, 3; 148/1.5, 188; 357/22, 91; 427/91

[56] References Cited

U.S. PATENT DOCUMENTS

| | | | |
|---|---|---|---|
| 3,793,088 | 12/1974 | Eckton | 148/1.5 |
| 3,806,371 | 4/1974 | Baron | 148/1.5 |
| 3,898,105 | 8/1975 | Mai et al. | 148/1.5 |
| 3,920,484 | 11/1975 | Ogura et al. | 148/1.5 |
| 3,969,744 | 7/1976 | Nicholas et al. | 357/22 |
| 3,986,896 | 10/1976 | Ueno et al. | 148/1.5 |

*Primary Examiner*—Charles E. Van Horn
*Assistant Examiner*—Jerome W. Massie
*Attorney, Agent, or Firm*—Hill, Gross, Simpson, Van Santen, Steadman, Chiara & Simpson

[57] ABSTRACT

A process for producing an integrated circuit having a pair of complementary field effect transistors, one being a J-FET and the other being a MIS-FET. The process includes a series of masking and ion implantation steps carried out in part for both transistors at the same time. The doping of the region between the source and drain is increased for the MIS-FET at the same time that the doping of the channel of the J-FET is increased in order to control the threshold voltage of the MIS-FET.

4 Claims, 8 Drawing Figures

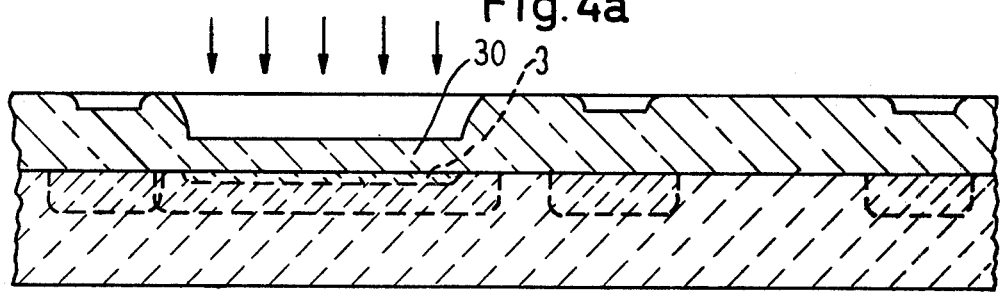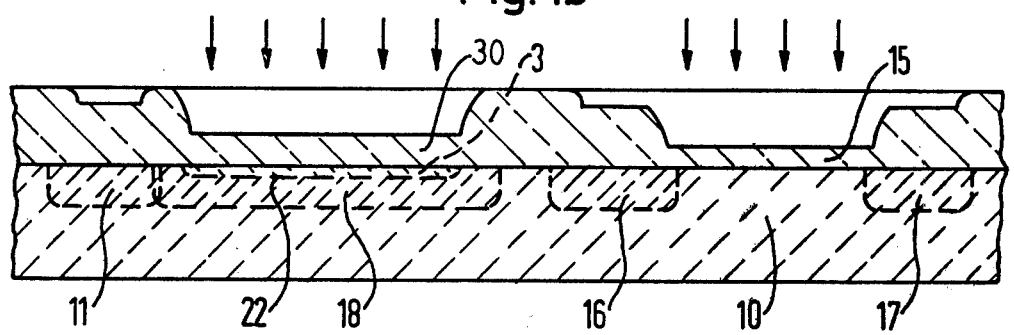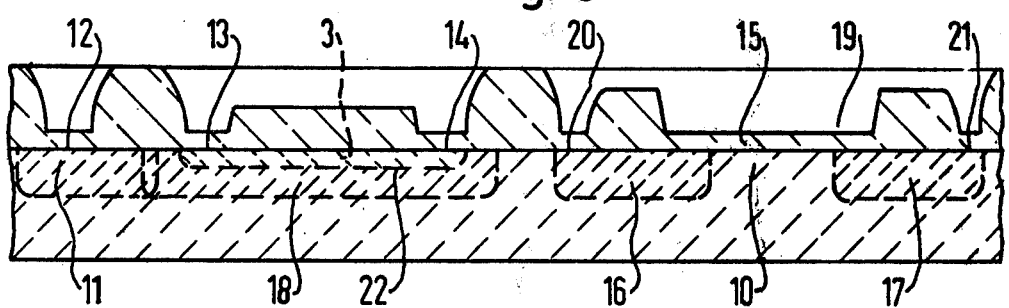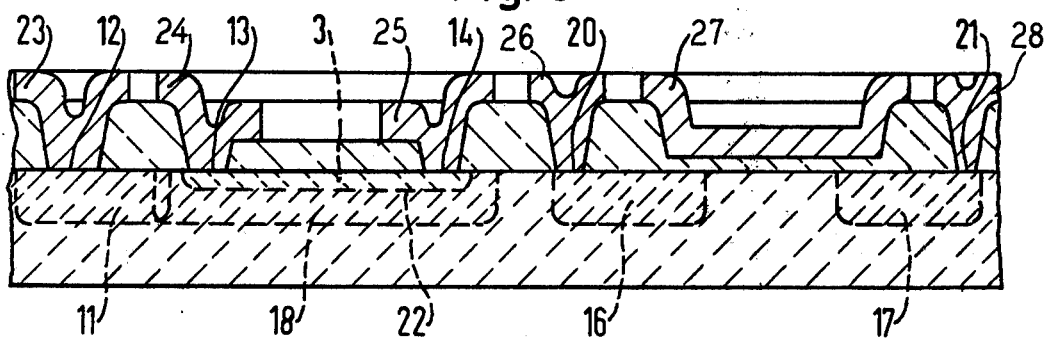

PROCESS FOR PRODUCING AN INTEGRATED CIRCUIT INCLUDING A J-FET AND ONE COMPLEMENTARY MIS-FET

BACKGROUND OF THE INVENTION

This invention relates generally to the manufacture of an integrated circuit which includes complementary field effect transistors, one of which is a junction field effect transistor, and the other of which is a MIS-FET. A storage element having such a construction is described, for example, IEEE Transactions ED, 1974, P. 448. The production of such components, for example, in a monocrystalline silicon chip, involves many difficulties. These difficulties result from the fact that in the production of two transistor types, it is necessary to carry out high-temperature processes which affect the production process on a second transistor which has already been produced.

SUMMARY OF THE INVENTION

The aim of the invention is to provide a production process for an integrated circuit, in which a junction field effect transistor, together with a complementary MIS field effect transistor, can be produced without any individual procedures of the production process having a disadvantageous influence on one another, and wherein the number of individual procedures required for the production process is reduced.

This objective is realized by a process as hereinafter described.

The invention is based on the fact that the production procedures which are required, for example, for the junction field effect transistor, can in part also be used for the production of the MIS field effect transistor. To ensure that the production of the two transistors does not take place in the form of a succession of individual process steps, but can take place at the same time, known production processes for the production of these transistors must be modified by additional process steps. In accordance with the invention, the modification is effected in such a manner that a normal aluminum gate process is provided with two additional process steps. The first additional step is constituted by an implantation step in which the doping material having the first conductivity type is implanted in the region of a substrate where the J-FET is to be formed. Then a doping with a dopant of the first conductivity type is effected by diffusion and at the same time, a curing of the implantation doping. An etching step is then followed by the doping, necessary for the production of the field effect transistor, using dopant of the second conductivity type in an implantation process. The other process steps which are required for the production of these two transistor types, such as, e.g., the etching away of the insulating layer and the application of the contacts serve in the same way for the production of both transistors.

It is known that it is possible to adjust the start voltage of MIS-transistors by implanting the channel zone with dopant ions. In an advantageous modification of the process of the invention, the implantation necessary for the adjustment of the start voltage of the MIS transistor can be carried out in such a manner that before the implantation of the second dopant, the insulating layer is removed in the gate zone of the provided MIS transistor and a gate insulating layer is applied to that point. Subsequently, the implantation is carried out with the second dopant. This process enables the doping which is required for the production of the junction field effect transistor and which is carried out with the dopant of the second conductivity type to be combined with the ion implantation doping which is required for the adjustment of the start voltage of the MIS-transistor, in one doping step.

In a further modification of the process of the invention, it is taken into account that a pn-junction layer can be obtained in a semiconductor body by having two dopants of different conductivity type simultaneously implanted, these dopants differing in terms of their speed of diffusion in the semiconductor. Thereafter, a heat treatment is carried out, in which the implanted dopants travel into the semiconductor body. On account of the different speeds of travel, different dopant concentrations occur for the relevant dopant in the semiconductor, which causes a pn-junction layer to be formed. In accordance with a further development of the invention, this fact is exploited in that simultaneously with the implantation of the dopant of the first conductivity type, a dopant of the second conductivity type is implanted, which dopants differ from one another in their diffusion speed in the semiconductor substrate. In this further development, the heat process required for the production of the pn-junction layer is simultaneously used to diffuse in dopant for the doping of the gate electrode of the junction field effect transistor and for the source and drain electrode of the MIS field effect transistor. In accordance with the further development of the invention, windows are etched into the insulating layer at those zones provided for the gate electrode of the junction field effect transistor and for the source- and drain- electrodes of the MIS field effect transistor, and in the region of these windows the semiconductor is provided with dopant material. This is followed by the above-described heat treatment in which the pn-junction layer is formed and in which the dopants located on the semiconductor surface are diffused into the semiconductor.

BRIEF DESCRIPTION OF THE DRAWINGS

FIGS. 1, 2, 3a, 3b, 4a, 4b, 5 and 6 illustrate schematically various stages in carrying out the production process of the present invention.

DESCRIPTION OF THE PREFERRED EMBODIMENTS

Figure 1:
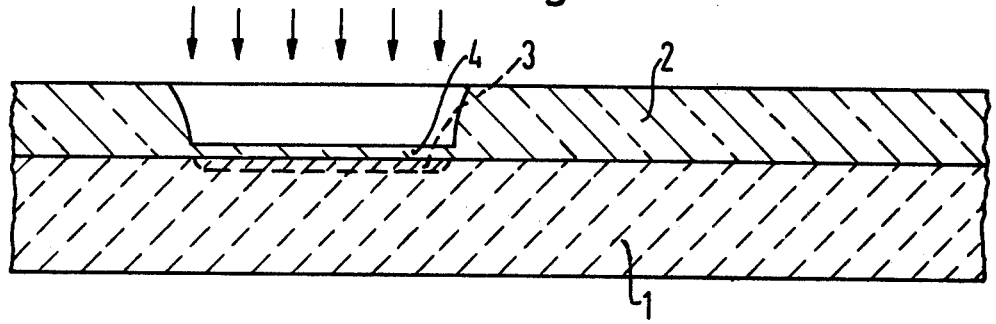

The production of a p-channel junction field effect transistor together with an n-channel MOS effect transistor on a substrate consisting of p-conducting silicon will now be described. Referring first to FIG. 1, a substrate 1 is doped with boron to cause it to be p-conducting. The impurity concentration is of the order of $10^{14}$ to $10^{16}/cm^3$. The silicon dioxide layer 2 is then applied to the substrate over one major surface thereof by a thermal treatment in the presence of oxygen. In the region of zone 3 provided for the p channel of the junction field effect transistor, the silicon dioxide layer 2 is removed by an etching process and thereafter a thin silicon dioxide layer 4 having a thickness of approximately $0.1 \mu m$ is grown again by temporary heat treatment in the presence of oxygen. Thereafter, implantation of an n dopant, e.g., phosphorus is carried out. The phosphorus only slightly penetrates through the thin oxide layer so that the semiconductor is doped only in the part 3 lying beneath the thin oxide layer. The implantation is carried out with a dose of approximately $5 \times 10^{15}$ /cm². The kinetic energy of the oncoming dopant ions and the thickness of the masking oxide layer 4 is selected to be such that the maximum doping concentration occurs at a distance of approximately 0.5μm to approximately 2μm beneath the surface of the silicon substrate. The kinetic energy of the ions amounts, for example, to 300 keV, and the thickness of the masking oxide layer is between approximately 0.05 and 0.2μm.

Figure 2:
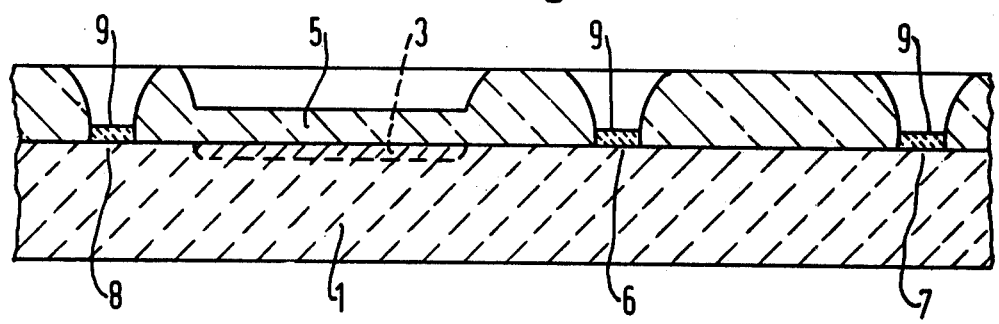

A masking oxidation is now carried out and then windows 6, 7 and 8 are opened through the oxide layer to the surface of the substrate. Window 6 is above the zone where the source of the MIS-FET will be formed in the substrate; window 7 is above the zone where the drain of the MIS-FET will be formed; and window 8 is above the zone where the end of the conducting path leading to the gate electrode of the J-FET is to be formed. Now the exposed points of the substrate are provided with an n-doping material 9, such, for example, as phosphorus (see FIG. 2).

At this point, the diffusing-in of the n dopant and the curing of the n implantation are carried out simultaneously at a high temperature of approximately 1000° C in the presence of oxygen for one hour.

Figure 3A:
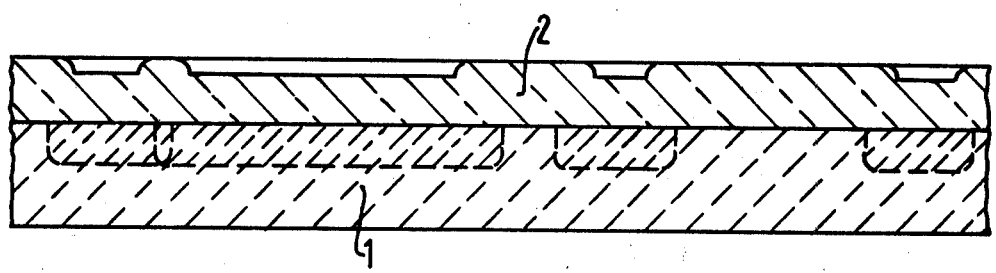
Figure 3B:
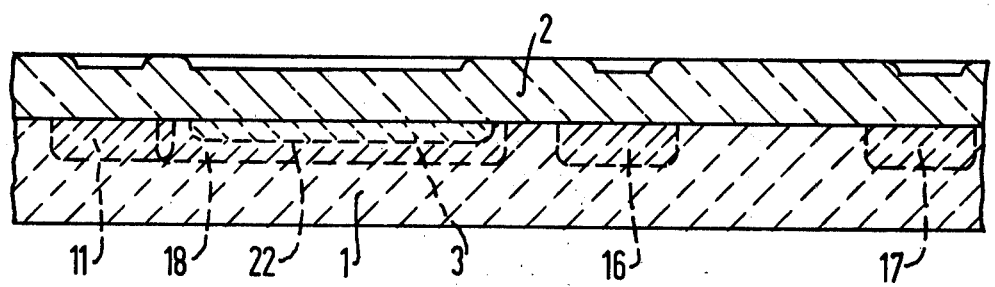

Now the points 6, 7 and 8, which had been etched free are again covered with silicon dioxide (FIG. 3a).

Next, the p implantation zones are etched in the silicon dioxide layer which has grown again as a result of the high temperature process. To this end, the same mask is used as for the n implantation zone. Thereafter, a thin silicon dioxide layer 30 having a thickness of approximately 0.1 um is grown again in the presence of oxygen. The zone 3 is then p doped with boron by implantation. (FIG. 4a). If the start voltage of the MIS transistor is to be set simultaneously in this process step during the etching process, that part 10 of the semiconductor substrate lying above the provided channel zone of the MIS transistor is freed by the same etching process. The production process is now continued in the usual manner. The gate zone 19 (FIG. 5) of the n-channel MIS transistor, and the zones of the contact holes 12, 13 and 14 for both transistors are etched. Then a thin oxide 15 is produced by thermal growth at a temperature of approximately 1000° C at those points which have been etched free. Simultaneous to this high temperature step, the diffusing-in and the curing of the p implantation with boron is effected. Next, the contact holes 12, 13 and 14, 20 and 21 are opened by an etching process, and vapor deposition with aluminum is carried out to produce the contacts 23, 24, 25, 26, 27 and 28.

It will be noted that the gate of the J-FET is indicated at 18. The p-type channel is indicated as 3 in FIG. 6. The source, of course, is the left-hand end of the p channel 3, and the drain is the right hand end of the p channel 3.

From FIG. 6, it will be noted that the source of the MIS-FET is the n-type region 16, while the drain is the n-type region 17. Thus, an n-channel enhancement type MIS-FET is formed.

Following the vapor deposition of aluminum which forms the contacts for the two transistors, vapor deposition of aluminum may be formed as a layer and then etched to form the conductor paths required for the circuit.

It will be apparent to those skilled in the art that many modifications and variations may be effected without departing from the spirit and scope of the novel concepts of the present invention.

We claim as our invention:

1. Process for the production of an integrated circuit with a MIS field effect transistor having a channel of a first conductivity and a complementary junction field effect transistor having a channel of a second conductivity which includes:
  a. forming an insulating layer on one major surface of a semiconductor substrate of the first type conductivity;
  b. forming a first window partially through said insulating layer above the region where the J-FET is to be formed;
  c. implanting ions of the first conductivity type through said window into a thin region of said substrate below its surface;
  d. increasing the thickness of the insulating layer at the base of said window;
  e. forming second, third and fourth windows through said insulating layer;
  f. forming a thin layer of doping material of the first conductivity type on said substrate at the base of each of said second, third and fourth windows;
  g. heat treating the substrate at approximately 1000° C in the presence of a reactive gas to spread by diffusion the zones of the first impurity type;
  h. again covering the treated surface with an insulating layer;
  i. partially reopening said first window;
  j. implanting ions of the second conductivity type through said first window to form a region of the second conductivity type in the upper portion of the zone of the first conductivity type;
  k. forming a fifth window partially through the insulating layer above where the channel of the MIS-FET is to be formed;
  l. subjecting said first and fifth windows to an ion bombardment of the second impurity type in an amount to fix the turn-on voltage of the MIS-FET at a predetermined value;
  m. forming windows through the insulating layer for the gate, source and drain electrodes of the J-FET and for the source and drain electrodes of said MIS-FET and partially through the insulation layer for gate electrode of the FET; and
  n. forming electrodes in said windows.

2. Process for the production of an integrated circuit in a single semiconductor substrate having a MIS field effect transistor having one channel of a first conductivity type and a complementary junction field effect transistor having a channel of the second conductivity type, which includes the sequence of the following steps:
  a. applying a first insulating layer having a thickness of approximately 0.5μm on the surface of a major surface of the semiconductor substrate of the first conductivity type;
  b. etching away of that part of the insulating layer which lies over a first zone of the semiconductor substrate provided for the pn-junction layer of the junction field effect transistor and producing a thin insulating layer having a thickness of approximately 0.05μm to 0.2 m in the zone having been etched away in this manner;
  c. implanting a dopant of the first conductivity type in said first zone using an implantation mask, the implantation being effected in such a way that the maximum of the dopant concentration occurs at a distance of approximately 0.5μm to approximately 2μm beneath said major surface of the semiconductor substrate;

d. applying a masking insulating layer above the first implanted zone of the semiconductor substrate;

e. etching away of the insulating layer over second and third zones of the substrate provided for source and drain of the MIS transistor, and that fourth zone of the semiconductor substrate provided for the gate contact of the junction field effect transistor;

f. applying a dopant of the first conductivity type onto the second, third and fourth zones of the semiconductor substrate which have been freed of the insulating layer;

g. diffusing-in the dopant and subsequent high temperature treatment of the semiconductor substrate in the presence of a reactive gas, so that the semiconductor substrate is again coated for a second time with an insulating layer;

h. producing a thin insulating layer whose thickness is approximately 0.05μm to 0.2μm, over the first zone of the semiconductor substrate, by etching away the first insulating layer and subsequent regrowth with a high temperature process in the presence of a reactive gas;

i. implanting the semiconductor substrate in the first zone with a dopant of the second conductivity type;

j. etching away of the insulating layer at those zones of the semiconductor substrate which are provided for the gate electrode of the MIS transistor;

k. producing the gate insulating layer of the MIS field effect transistor by heating the semiconductor substrate in the presence of a reactive gas;

l. etching away of the insulating layer at those points provided for the contacts to the semiconductor substrate for the gate, source and drain of the J-FET and for the source and drain of the MIS-FET;

m. vapor depositing contact metal in the region of the contact holes and the gate insulating layer of the MIS-transistor; and n. etching of the contact conductor paths out of the vapor deposited contact metal layer.

3. Process according to claim 2, in which in order to adjust the start voltage of the MIS transistor, prior to the implantation of the dopant of the second conductivity type, the first insulating layer is removed in the gate zone of the MIS transistor, and a thin oxide layer is applied, and then, simultaneously to the first zone, the part of the semiconductor substrate lying beneath the gate insulating layer of the MIS-FET is doped by implantation.

4. Process according to claim 2, in which simultaneously to the implantation with dopant of the first conductivity type, a dopant of the second conductivity type is implanted, which dopants differ from one another in respect to their diffusion speed in the semiconductor substrate, then prior to the production of the gate insulating layer of the MIS transistor, the first insulating layer is removed at those zones provided for the gate electrode of the junction field effect transistor and for the source and drain electrodes of the MIS field effect transistor, where dopant of the first conductivity type is applied to the semiconductor substrate and diffused-in.

* * * * *